United States Patent
Oka et al.

(10) Patent No.: US 8,597,459 B2
(45) Date of Patent: Dec. 3, 2013

(54) CONDUCTIVE PASTE AND METHOD FOR MANUFACTURING MULTILAYER PRINTED WIRING BOARD USING THE SAME

(75) Inventors: Yoshio Oka, Osaka (JP); Hitoshi Takii, Osaka (JP); Noriki Hayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 874 days.

(21) Appl. No.: 11/664,393

(22) PCT Filed: Sep. 26, 2005

(86) PCT No.: PCT/JP2005/017591
§ 371 (c)(1),
(2), (4) Date: Mar. 30, 2007

(87) PCT Pub. No.: WO2006/035692
PCT Pub. Date: Apr. 6, 2006

(65) Prior Publication Data
US 2008/0099121 A1  May 1, 2008

(30) Foreign Application Priority Data
Sep. 30, 2004  (JP) ............... P2004-286499

(51) Int. Cl.
*B29C 65/00* (2006.01)
*B32B 37/00* (2006.01)

(52) U.S. Cl.
USPC ............ 156/306.6; 156/293; 156/330

(58) Field of Classification Search
USPC ....... 257/E21.514; 156/330, 290, 293, 306.6, 156/306.9
See application file for complete search history.

(56) References Cited

U.S. PATENT DOCUMENTS

| | | | | |
|---|---|---|---|---|
| 5,401,913 A | * | 3/1995 | Gerber et al. | 174/264 |
| 5,843,251 A | * | 12/1998 | Tsukagoshi et al. | 156/64 |
| 5,914,358 A | | 6/1999 | Kawakita et al. | |
| 6,107,419 A | * | 8/2000 | Kobayashi et al. | 525/481 |
| 6,620,344 B2 | | 9/2003 | Sano et al. | |

(Continued)

FOREIGN PATENT DOCUMENTS

| | | |
|---|---|---|
| CN | 1236798 | 12/1999 |
| CN | 1444073 | 9/2003 |

(Continued)

OTHER PUBLICATIONS

WO 2004/070827 Aug. 2004 Fujimoto et al.*

(Continued)

*Primary Examiner* — John Goff
(74) *Attorney, Agent, or Firm* — McDermott Will & Emery LLP

(57) ABSTRACT

There is provided a conductive paste obtained by kneading conductive particles into an epoxy resin and having good filling ability into a via hole, which can form a connected portion wherein the connection resistance does not change with time even under high temperature and high humidity conditions. Also, there is provided a method for manufacturing a multilayer printed wiring board using the conductive paste.
A conductive paste containing conductive particles and a resin mixture wherein the content of the epoxy resin having a molecular weight of 10,000 or more is from 30 to 90% by weight in the total resin component and whose elastic modulus at 85° C. after curing is 2 GPa or less, the content of the conductive particle being from 30 to 75% by volume. Furthermore, a method for manufacturing a multilayer printed wiring board using the conductive paste.

4 Claims, 2 Drawing Sheets

(56) References Cited

U.S. PATENT DOCUMENTS

| | | | |
|---|---|---|---|
| 7,524,748 B2* | 4/2009 | Fujimoto et al. | 438/597 |
| 2003/0174273 A1* | 9/2003 | Matsui et al. | 349/151 |
| 2003/0216505 A1 | 11/2003 | Akiba et al. | |

FOREIGN PATENT DOCUMENTS

| | | |
|---|---|---|
| EP | 0 955 795 A2 | 11/1999 |
| JP | 6-152139 | 5/1994 |
| JP | 2001-135140 | 5/2001 |
| JP | 2001-319523 | 11/2001 |
| JP | 2002-157918 | 5/2002 |
| JP | 2002231764 A * | 8/2002 |
| JP | 2002252437 A * | 9/2002 |
| JP | 2003-92024 | 3/2003 |
| JP | 2003-324268 | 11/2003 |
| JP | 2004-165066 | 6/2004 |
| JP | 2004-214277 | 7/2004 |
| JP | 2004-228322 | 8/2004 |
| JP | 2004-241238 | 8/2004 |
| TW | 200402754 A | 2/2004 |

OTHER PUBLICATIONS

Machine translation for JP 2001-135140 Aug. 10, 2009.*
Machine translation of JP 2002-252437 date unknown.*
Chinese Office Action, with English Translation, issued in Chinese Patent Application No. CN 200580033200.6 dated Jan. 16, 2009.
International Preliminary Report on Patentability and Written Opinion of the International Searching Authority issued in International Application No. PCT/JP2005/017591, dated Apr. 3, 2007.
European Search Report issued in European Patent Application No. EP 05785720.3-2102 dated on Oct. 2, 2008.
Japanese Office Action, with English translation, issued in Japanese Patent Application No. 2004-286499, mailed May 11, 2010.
European Search Report issued in European Patent Application No. 11150365.2-2102, mailed May 4, 2011.
Taiwanese Office Action, with English translation, issued in Taiwanese Patent Application No. 094133870, dated Nov. 9, 2011.

* cited by examiner

CONDUCTIVE PASTE AND METHOD FOR MANUFACTURING MULTILAYER PRINTED WIRING BOARD USING THE SAME

RELATED APPLICATIONS

This application is a national phase of PCT/JP2005/017591 filed Sep. 26, 2005, which claims priority from Japanese Application No. 2004-286499 filed Sep. 30, 2004, the disclosures of which Applications are incorporated by reference herein. The benefit of the filing and priority dates of the International and Japanese Applications is respectfully requested.

TECHNICAL FIELD

The present invention relates to a conductive paste which is filled into a via hole or the like to be formed in a production process of a multilayer printed wiring board to achieve electrical connection between circuits (between layers). The invention further relates to a method for manufacturing a multilayer printed wiring board comprising a step of filling the via hole with the conductive paste.

BACKGROUND ART

A multilayer printed wiring board is known as a technology capable of achieving a high-density mounting of parts and of connecting the parts in the shortest distance. An interstitial via hole (IVH) is a technology which is applied to the production of a multilayer printed wiring board for which higher-density mounting is required, and is characterized by filling a conductive material into a hole (via hole) opened between neighboring layers to electrically connect the circuits of the neighboring layers each other. According to IVH, since interlayer connection can be formed only at necessary portions and a part can be mounted also on the via hole, it becomes possible to achieve a high-density wiring having a high degree of freedom.

As the conductive paste to be filled into such a via hole, there has been used one wherein conductive particles are kneaded into a low-viscosity resin, e.g., a low-viscosity epoxy resin. For example, JP-A-2003-92024 (Patent Document 1) discloses "a via hole-filling conductive paste composition wherein a conductive powder obtained by mixing a plurality of conductive powders having an average particle diameter ranging from 0.5 μm to 20 μm and having different average particle diameters (=conductive particles) is dispersed into a liquid epoxy resin (=a low-viscosity epoxy resin)". In the conductive paste, in order to solve the problem of generation of concavity at filling, conductive particles obtained by mixing two or more conductive powders having different average particle diameters are used.

As the conductive particles to be mixed with such a conductive paste, a flat filler resulting a high conductivity is preferably used. However, the conductive paste wherein a flat filler is used as conductive particles and it is kneaded into a low-viscosity resin, e.g., a low-viscosity epoxy resin suffers from the problem that filling ability into via holes is poor and bubbles remain in via holes after filling.

When the filling ability into a via hole becomes worse, insufficient connection between the circuits and the like may be induced and reliability of the connection may be lowered. In particular, recently, with the requirement of miniaturization of electronic parts, a multilayer printed wiring board having higher density is required and a via hole having smaller diameter is desired. As a result, the problem that the filling of the via hole becomes more difficult and the reliability of the connection is lowered by the decrease of the filling ability tends to become more remarkable.

Moreover, a multilayer printed wiring board wherein the electrical connection between the circuits is achieved by the filling of the conductive paste into the via hole is sometimes placed under an environment of high temperature and high humidity for a long period of time and it is desired that the electrical resistance (connection resistance) at the connected portion does not change with time. When the connection resistance changes with time, the reliability of the connection is lowered.

Therefore, it is desired to develop a conductive paste which has a good filling ability into a via hole and which can form a connected portion (via hole) with no change in connection resistance with time even under an environment of high temperature and high humidity.

Patent Document 1: JP-A-2003-92024

DISCLOSURE OF THE INVENTION

Problems to be Solved by the Invention

An object of the invention is to provide a conductive paste which is obtained by kneading conductive particles into an epoxy resin and has a good filling ability into a via hole and which can form a connected portion (via hole) with no change in connection resistance with time even under an environment of high temperature and high humidity. Furthermore, another object of the invention is to provide a method for manufacturing a multilayer printed wiring board using the above conductive paste.

Means for Solving the Problems

The invention provides a conductive paste containing conductive particles and a resin mixture, wherein the content of an epoxy resin having a molecular weight of 10,000 or more is from 30 to 90% by weight in the total resin component whose elastic modulus at 85° C. after curing is 2 GPa or less, and the content of the conductive particle is from 30 to 75% by volume (claim 1).

As a result of investigations, the present inventors have found that the filling ability into a via hole is improved by using a mixed resin containing a predetermined ratio of an epoxy resin having a molecular weight of 10,000 or more and the change in electrical resistance at the connected portion formed using the conductive paste with time under an environment of high temperature and high humidity can be reduced by controlling elastic modulus after curing of the resin mixture containing the resin to a predetermined value or less. Thus, they have accomplished the invention composed of the above constitution.

The resin contained in the resin mixture constituting the conductive paste of claim 1 comprises an epoxy resin as a main component but may contain a phenol resin, a polyamideimide resin, a polyimide resin, a polyester resin, and the like in addition to the epoxy resin.

The resin contains an epoxy resin having a molecular weight of 10,000 or more in an amount of 30 to 90% by weight. The epoxy resin having a molecular weight of 10,000 or more is an epoxy resin wherein a weight-average molecular weight in terms of polystyrene measured by GPC is 10,000 or more. As the structure, a bisphenol A type, a bisphenol F type, a bisphenol A/F mixed type, or the like may be mentioned.

As described above, by incorporating the epoxy resin having a molecular weight of 10,000 or more, the filling ability into the via hole is improved and the presence of remaining bubbles in the via hole after filling can be prevented. It is considered that smooth filling into the via hole is prevented by cohesive force among the conductive particles in the conductive paste and, particularly in the case of the flat filler, the cohesive force is large and hence decrease in filling ability is also remarkable. The epoxy resin having a molecular weight of 10,000 or more functions as one kind of viscoelasticity-controlling agent and a weak network structure is formed by the incorporation thereof. It is considered that the cohesive force among the conductive particles is relaxed by the weak network structure, leveling ability is improved and hence the filling ability into the via hole is enhanced.

The components other than the epoxy resin having a molecular weight of 10,000 or more in the resin is an epoxy resin having a molecular weight of less than 10,000 and resins other than an epoxy resin. As the resins other than an epoxy resin, a phenol resin, a polyimide resin, a polyester resin, and the like may be mentioned. When the mixing ratio of the epoxy resin having a molecular weight of 10,000 or more is less than 30% by weight, the improvement of the filling ability into the via hole is not obtained. On the other hand, when the filling into the via hole is conducted using a conductive paste having a mixing ratio of more than 90% by weight, increase in connection resistance at the formed connected portion under an environment of high temperature and high humidity with time becomes large and hence the case is not preferable.

The resin mixture constituting the conductive paste of the invention usually contains a curing agent for curing the epoxy resins, in addition to the resins. As the curing agent, in order to prevent the progress of the curing reaction during storage at room temperature and enhance the storage stability, a latent curing agent is preferably used.

The resin mixture is also characterized in that the elastic modulus at 85° C. of the cured resin after its curing is 2 GPa or less. Owing to the characteristic, change in connection resistance with time is suppressed when the connected portion (interlayer connected portion) formed by filling the conductive paste into the via hole is placed under an environment of high temperature and high humidity and thus the reliability of the connection is improved.

When the above connected portion is placed under an environment of high temperature and high humidity, for example, under conditions of humidity-resistance test of 85° C. and 85%, strain and stress at interface are generated owing to moisture absorption of the resin, change in temperature and humidity, and the like. When the elastic modulus at 85° C. exceeds 2 GPa, the strain and stress cannot be absorbed and exfoliation and the like may be generated, so that increase in connection resistance may be induced. However, it is considered that the strain and stress are absorbed and relaxed by controlling the elastic modulus to 2 GPa or less.

The elastic modulus of the above cured resin varies depending on the kind and mixing ratio of the resins to be mixed and the kind and amount of the curing agent and thus the elastic modulus within the above range can be obtained by controlling these factors. For example, when an epoxy resin having a large elastic modulus is used, a resin having an elastic modulus at 85° C. of 2 GPa or less can be obtained by mixing a resin having a small elastic modulus. As the resin having a small elastic modulus, a rubber-modified epoxy resin or the like may be mentioned.

As the conductive particles constituting the conductive paste of the invention, there may be preferably exemplified at least one kind of fine particles selected from gold, platinum, palladium, copper, nickel, tin, lead, and alloys thereof, fine particles comprising conductive or nonconductive particles as nuclei and covered with at least one metal selected from gold, platinum, palladium, copper, nickel, tin, lead, and alloys thereof, or a mixture of these fine particles or carbon fine particles.

The average particle diameter of the conductive particles is usually preferably from about 0.5 to 20 μm. In the case of the flat filler, the average particle diameter herein is regarded as an average value of the major axis. In particular, when the conductive particles are composed of the flat filler, a high conductivity is achieved, so that the case is preferable. Moreover, the advantage of the invention that the filling ability into the via hole is improved is particularly exhibited in the case that the conductive particles contain the flat filler. Claim 2 corresponds to the preferred embodiment. The flat filler refers to a filler wherein a ratio of major axis/minimum thickness of the filler is 3 or more.

The content of the conductive particles is a ratio that the conductive particles in the conductive paste after curing account for 30 to 75% by volume. When the content is smaller than 30% by volume, a sufficient electrical connection is not achieved and the connection resistance at the connected portion tends to increase. On the other hand, when it exceeds 75% by volume, the mechanical strength of the conductive paste after curing decreases and cracks, exfoliation, and the like are generated, so that the reliability of the connection tends to be lowered.

To the conductive paste of the invention, a solvent or the like for adjusting viscosity may be added, if necessary, in addition to the above components. As the solvent to be used, there may be mentioned butylcarbitol acetate, ethylcarbitol acetate, triglyme, isophorone, butylcarbitol, ethylcarbitol, γ-butyrolactone, cellosolve acetate, and the like. The addition amount of the solvent is preferably an amount so that the viscosity of the conductive paste after addition and dispersion of the conductive particles becomes in the range of 10 to 500 Pa·S (rotational viscosity at one revolution minute).

The conductive paste of the invention is one wherein the conductive particles are dispersed into the resin mixture and is obtained by a method of mixing and kneading resin components constituting the resin mixture and a curing agent with the conductive particles. In the case that the viscosity after mixing is high and thus the filling into the via hole is difficult, a solvent or the like may be further incorporated. At the mixing and kneading, the addition order of the individual components of the resin, the curing agent, the conductive particles, and the solvent is not particularly limited. Moreover, each component may be added with dividing it into two portions.

As a method for manufacturing a multilayer printed wiring board using the above conductive paste of the invention, the invention provides a method for manufacturing a multilayer printed wiring board including: a step of forming a via hole in an insulating substrate having a conductive layer provided on one surface thereof, the via hole passing through to the conductive layer, and a step of filling the conductive paste into the via hole (claim 3).

As the insulating substrate having a conductive layer provided on its one surface, a copper-clad polyimide resin base material (CCL) wherein a copper foil is attached on one surface may be exemplified. A boring processing is conducted with laser or the like in a position, to which interlayer connection (electrical connection between circuits) is desired, of the insulating substrate to form a via hole (bottomed hole). The via hole passes through the insulating substrate, and one end opens on the surface opposite to the surface to which the conductive layer is attached and another end reaches the conductive layer.

After the formation of the via hole, the conductive paste of the invention is filled into the via hole. The filling method is not particularly limited but, for example, a method of filling it by screen printing may be mentioned.

The method for manufacturing a multilayer printed wiring board according to the invention comprises the formation of via hole and the filling of the conductive paste into the via hole as essential steps. More specifically, Method 1 and Method 2 described in the following may be exemplified.

(Method 1)

First, after an adhesive layer is attached to the surface, opposite to the conductive layer, of the insulating substrate (polyimide resin base material etc.) having a conductive layer (copper foil etc.) provided on its one surface, boring processing is conducted with laser to form a via hole. Namely, the formation of the via hole is carried out after lamination of an adhesive layer and the like at the insulating substrate side. In this regard, before or after the formation of the via hole, a circuit is formed on the insulating substrate by etching the conductive layer or the like method to obtain a wiring board base material.

The conductive paste of the invention is filled into the via hole of the wiring board base material by screen printing. The wiring board base material thus obtained and another wiring board base material wherein a circuit is formed are laminated with positioning and subjected to interlayer adhesion by heating and pressurization by means of a cure press or the like to obtain a multilayer printed wiring board.

However, in this Method 1, two times of heating is necessary at the stage of attaching the insulating substrate to the adhesive layer and at the stage of interlayer adhesion. Moreover, since the elastic modulus and coefficient of thermal expansion of the insulating substrate or wiring board base material are usually much different from those of the adhesive layer, warp and stress-strain are generated at the time when the insulating substrate is attached to the adhesive layer. As a result, there arises a problem that displacement is apt to be generated at the stage of formation of the via hole and percent defective increases.

Thus, preferably, the following Method 2 may be mentioned, which does not involve such a problem.

(Method 2)

In the insulating substrate having a conductive layer provided on its one surface, a via hole passing through to the conductive layer is formed, and a bump of a conductive substance is formed by filling the above conductive paste into the via hole. In this regard, before or after the formation of the bump and via hole, a circuit is formed on the insulating substrate by etching the conductive layer or the like method to obtain a wiring board base material. On the other hand, a through hole having a diameter larger than that of the above via hole is formed in a position, corresponding to the above via hole, of the adhesive sheet to obtain an adhesive layer.

The wiring board base material and adhesive layer thus obtained are overlaid so that the adhesive layer comes into contact with the surface opposite to the above circuit and further another insulating substrate (wiring board base material) having a conductive layer circuit is overlaid, and they are laminated collectively and subjected to interlayer adhesion by heating and pressurization by means of a cure press or the like to obtain a multilayer printed wiring board. In this method, since the attachment of the wiring board base material to the adhesive layer is not carried out before the interlayer adhesion, the problem of warp or the like does not arise.

Claim 4 corresponds to the preferred embodiment and provides a method for manufacturing a multilayer printed wiring board as mentioned above, which comprises a step of forming a bump of a conductive substance by filling the conductive paste and a step of overlaying a wiring board base material obtained by forming a circuit on the above conductive layer and an adhesive layer obtained by forming a through hole having a diameter larger than that of the above via hole in a position, corresponding to the via hole, of the adhesive sheet so that the above adhesive layer comes into contact with the surface opposite to the above conductive layer, further overlaying another insulating substrate having a conductive layer circuit, and lamination-pressing them collectively.

The bump of the conductive substance is a protrusion of the conductive substance formed on the via hole and is formed for the purpose of contact with the conductive layer (circuit) such as another wiring board base material. The method for forming the bump is not particularly limited but, for example, there may be exemplified a method of forming a releasing layer on the insulating substrate, forming a via hole passing through the insulating substrate and the releasing layer, filling the conductive paste into the via hole, and subsequently peeling the releasing layer to form the protrusion. As the releasing layer, there may be mentioned a masking film of polyethylene terephthalate (PET) and the like, which may be attached on the insulating substrate to form the releasing layer. Moreover, there may be also exemplified a method of filling the conductive paste into the via hole and subsequently printing the conductive paste further thereon (mound printing, bump printing) to mound the conductive substance and form the protrusion.

As a method of forming a circuit on the above conductive layer, an etching processing may be exemplified. For example, there may be exemplified chemical etching (wet etching) wherein, after a circuit pattern of a resist layer is formed on the conductive layer, the whole is immersed in an etchant, which corrodes the conductive layer, to remove the portion other than the circuit pattern, and subsequently the resist layer is removed. As the etchant in this case, there may be mentioned ferric chloride-based etchant containing ferric chloride as a main ingredient, cupric chloride-based etchant containing cupric chloride as a main ingredient, and the like.

An adhesive layer is obtained by forming a through hole having a diameter larger than that of the above via hole in a position, corresponding to the via hole, in the adhesive sheet. The formation of a through hole in a position corresponding to the via hole means the formation of a through hole so that the protrusion of the bump is inserted into the through hole. A method for forming a through hole is not particularly limited but there may be adopted a boring processing with laser, a method of mechanical boring using a drill or the like, and the like. The diameter of the through hole is preferably from 1.5 to 5 times, more preferably from 2 to 4 times the diameter of the via hole of the wiring board base material. As the adhesive sheet for forming the adhesive layer, one having a thickness of from about 10 μm to 100 μm may be usually used.

As another insulating substrate having a conductive layer circuit, a circuit of a conductive layer is provided on one surface or both surfaces of an insulating substrate and there may be exemplified one wherein a circuit is formed by subjecting a copper foil of a polyimide resin film, to which a copper foil has been attached on one surface or both surfaces, to etching or the like.

The method for manufacturing a multilayer printed wiring board can be applied to the case that a plurality of the wiring board base materials and adhesive layers manufactured as mentioned above. In this case, two or more wiring board base materials and adhesive layers are overlaid alternatively, i.e., overlaid so that an adhesive layer intervenes between different wiring board base materials, another insulating substrate having a conductive layer circuit is overlaid on the top adhesive layer, and subsequently the whole is laminated and pressed collectively.

As the insulating substrate, resin films mainly composed of PET or a polyimide may be exemplified. A resin film mainly composed of a polyimide is a heat-resistant film and can meet the requirements of high heat resistance corresponding to adoption of lead-free solder. As materials for the adhesive sheet forming the adhesive layer, there may be mentioned thermoplastic polyimide resins, resins partially having a thermosetting function mainly composed of a thermosetting polyimide, thermosetting resins such as epoxy resins and imide-based resins, and the like.

The multilayer printed wiring board manufactured by the above manufacturing method is an excellent multilayer printed wiring board wherein high-density mounting of parts is possible and also the reliability of the electrical connection between circuits is high, and change in connection resistance between circuits with time is also small. The multilayer printed wiring board is suitably used for the production of various electric appliances.

Effects of the Invention

The conductive paste of the invention exhibits a good filling ability into a via hole and thus a highly reliable connection between circuits can be obtained by filling the conductive paste into the via hole. Moreover, even when a multilayer printed wiring board obtained by filling the conductive paste into the via hole is placed under an environment of high temperature and high humidity, change in connection resistance with time is small and thus the reliability of the connection is high from the viewpoint. According to the method for manufacturing a multilayer printed wiring board wherein the conductive paste having such excellent characteristics is used, an excellent multilayer printed wiring board having a high reliability of electrical connection between circuits and exhibiting a small change in connection resistance between circuits with time can be manufactured.

Figure 1:
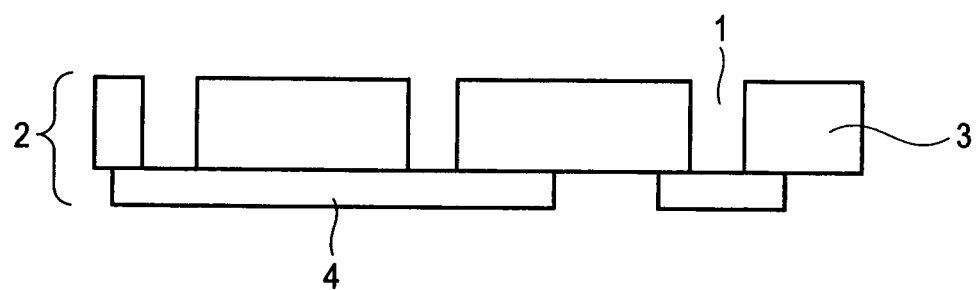
FIG. 1 is a cross-sectional pattern diagram showing one step for manufacturing multilayer printed wiring boards of Examples and Comparative Examples.

DESCRIPTION OF REFERENCE NUMERALS AND SIGNS 1 via hole
2 copper-clad laminate
3 polyimide layer
4 circuit (copper layer)
5 bump
6 through hole
7 bonding sheet
8 circuit
9 another copper-clad laminate
10 multilayer printed wiring board
11 polyimide layer
12 adhesive layer

BEST MODE FOR CARRYING OUT THE INVENTION

The following will describe best mode for carrying out the present invention with reference to Examples. However, the invention is not limited to Examples.

EXAMPLES

Example 1

A flat Ag filler having an average particle diameter (50% D) of 4 μm is added to 70% by weight of a bisphenol A-type resin (high-molecular-weight type having a molecular weight of 55,000) and 30% by weight of a rubber (NBR)-modified epoxy resin [EPR4030 manufactured by Asahi Denka Kogyo K.K.) in an amount so that the ratio in a conductive paste after curing became 55% by volume, and butylcarbitol acetate is further added thereto as a solvent. The whole is mixed in a three-roll roller and then an imidazole-based latent curing agent is further added and mixed to manufacture a conductive paste. In this regard, the bisphenol A-type resin (high-molecular-weight type having a molecular weight of 55,000) is mixed with butylcarbitol acetate beforehand and then the rubber (NBR)-modified epoxy resin [epoxy equivalent: 380 g/eq] and the like are added.

Example 2

A conductive paste is manufactured in the same manner as in Example 1 except that a bisphenol F-type epoxy resin [Epicoat 806 manufactured by Japan Epoxy Resin K.K., epoxy equivalent: 160-170 g/eq] is used instead of the rubber (NBR)-modified epoxy resin.

Example 3

A conductive paste is manufactured in the same manner as in Example 1 except that a naphthalene bifunctional epoxy resin [HP4032 manufactured by Dainippon Ink and Chemicals, Incorporated, epoxy equivalent: 135-165 g/eq] is used instead of the rubber (NBR)-modified epoxy resin.

Example 4

A conductive paste is manufactured in the same manner as in Example 2 except that the mixing ratio of the bisphenol F-type epoxy resin [Epicoat 806 manufactured by Japan Epoxy Resin K.K., epoxy equivalent: 160-170 g/eq] is changed to 40% by weight.

Example 5

A conductive paste is manufactured in the same manner as in Example 2 except that the mixing ratio of the bisphenol F-type epoxy resin [Epicoat 806 manufactured by Japan Epoxy Resin K.K., epoxy equivalent: 160-170 g/eq] is changed to 15% by weight.

Comparative Example 1

A conductive paste is manufactured in the same manner as in Example 1 except that a naphthalene tetrafunctional epoxy resin [EXA-4700 manufactured by Dainippon Ink and Chemicals, Incorporated, epoxy equivalent: 155-170 g/eq] is used instead of the rubber (NBR)-modified epoxy resin.

Comparative Example 2

A conductive paste is manufactured in the same manner as in Example 1 except that the ratio of the bisphenol A-type resin (high-molecular-weight type having a molecular weight of 55,000) is changed to 100% by weight.

Comparative Example 3

A conductive paste is manufactured in the same manner as in Example 2 except that the mixing ratio of the bisphenol F-type resin is changed to 100% by weight.

Table 1 shows the kind, analytical values, and mixing ratio of the epoxy resins used in Examples 1 to 5 and Comparative Examples 1 to 3.

TABLE 1

|  | Bisphenol A-type epoxy resin | Rubber-modified epoxy resin | Bisphenol F-type epoxy resin | Naphthalene bifunctional epoxy resin | Naphthalene tetra-functional epoxy resin |
|---|---|---|---|---|---|
| Epoxy equivalent | 7000-8500 | 380 | 160-170 | 152 | 155-170 |
| Molecular weight | 55,000 | <900 | about 400 | <500 | <900 |
| OH-group concentration (mmol/g) | 9.0 | >0.3 | 0.34 | 1.0 | 0.9 |
| Example 1 | 70 | 30 |  |  |  |
| Example 2 | 70 |  | 30 |  |  |
| Example 3 | 70 |  |  | 30 |  |
| Example 4 | 60 |  | 40 |  |  |
| Example 5 | 85 |  | 15 |  |  |
| Comparative Example 1 | 70 |  |  |  | 30 |
| Comparative Example 2 | 100 |  |  |  |  |
| Comparative Example 3 |  |  | 100 |  |  |

Examples 6 to 10 and Comparative Examples 4 to 6

Figure 2:
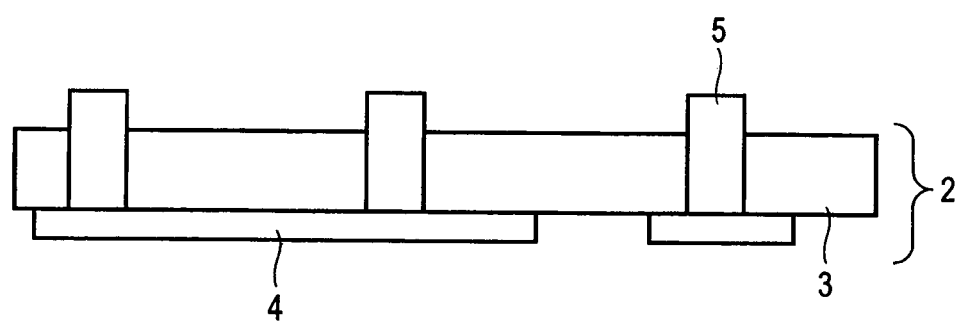
FIG. 2 is a cross-sectional pattern diagram showing one step for manufacturing multilayer printed wiring boards of Examples and Comparative Examples.

Irradiation with UV-YAG laser is conducted from the polyimide side of a copper-clad laminate (polyimide thickness: 25 μm, copper thickness: 18 μm) on which circuit had been manufactured, to form 8 via holes having a top diameter of 100 μm and then a wet desmear is carried out. Each of the conductive pastes manufactured in Examples 1 to 5 and Comparative Examples 1 to 3 is filled into the via holes by metal-plate printing. Thereafter, printing of the conductive paste (bump printing) is further carried out on the via holes to mound the conductive paste, whereby a bump is formed. FIG. 1 shows a cross-sectional pattern diagram of a copper-clad laminate 2 (a polyimide layer 3 and a circuit (copper layer) 4) after a via hole 1 is formed and FIG. 2 shows a cross-sectional pattern diagram of a copper-clad laminate 2 (a polyimide layer 3 and a circuit (copper layer) 4) after a bump 5 is formed.

Figure 3:
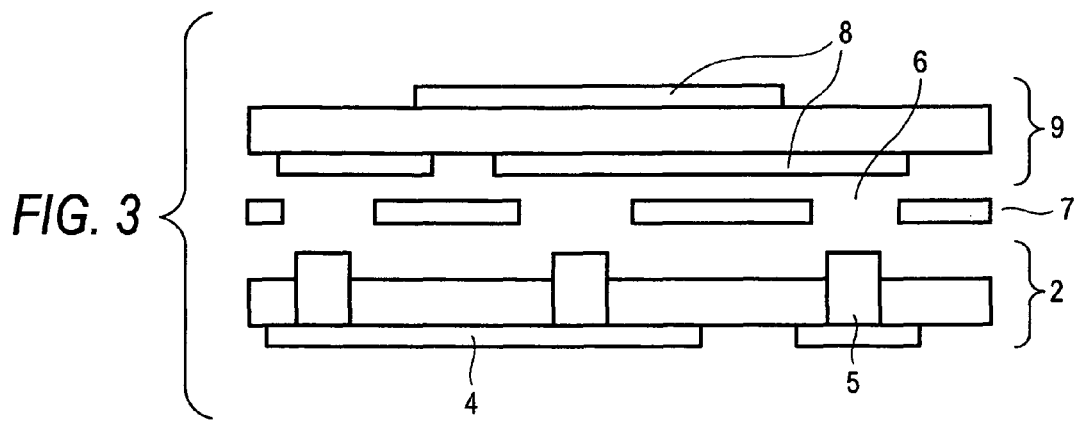
FIG. 3 is a cross-sectional pattern diagram showing one step for manufacturing multilayer printed wiring boards of Examples and Comparative Examples.
Figure 4:
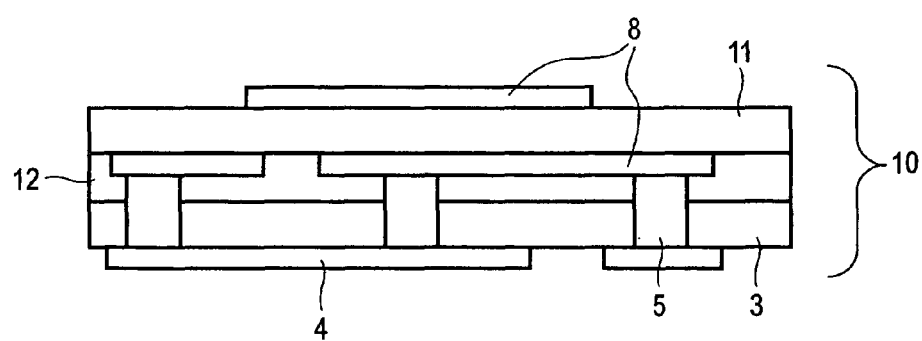
FIG. 4 is a cross-sectional pattern diagram showing one step for manufacturing multilayer printed wiring boards of Examples and Comparative Examples.

Then, as shown in the cross-sectional pattern diagram in FIG. 3, a bonding sheet (an adhesive layer) 7 where a through hole 6 had been formed is overlaid at the part corresponding to a via hole 1, another copper-clad laminate 9 where a circuit 8 had been formed is further overlaid, and a vacuum pressing is carried out to manufacture a multilayer printed wiring board 10 (daisy chain of 8 via holes) shown in the cross-sectional pattern diagram of FIG. 4.

The multilayer printed wiring board manufactured as above is stored under high temperature and high humidity conditions of 85° C. and 85% and a resistance change rate after the passage of 500 hours is measured. The results are shown in Table 2. In this regard, the measurement of the resistance change rate is a value obtained by measuring a resistance value of circuits connected with a conductive paste filled into 8 via holes by a 4-terminal method, the value being considered to be the total of the resistance of the conductive paste, the resistance of the conductive layer (circuit), and the contact resistance between the conductive paste and the conductive layer.

Reference Example 1

[Measurement of 85° C. Elastic Modulus]

The resin, the solvent, and the curing agent are thoroughly mixed in the same composition as the conductive pastes manufactured in Examples 1 to 5 and Comparative Examples 1 to 3 except that the conductive particles are not mixed, and then the mixture is defoamed using a defoaming apparatus (AWATORI RENTARO). Thereafter, the mixture is applied on a fluorocarbon resin film and, after curing, the film is released. The resulting film is cut into strips and elastic modulus at 85° C. is measured using DMS (dynamic viscoelasticity measuring apparatus). The results are shown in Table 2.

Reference Example 2

[Evaluation of Filling Ability into Via Hole]

Irradiation with UV-YAG laser is conducted from the polyimide side of a one-surface copper-clad laminate (polyimide thickness: 25 μm) to form via holes (blind via) having a top diameter of 25 μm and then desmear is carried out. Each of the conductive pastes manufactured in Examples 1 to 5 and Comparative Examples 1 to 3 is filled into the via hole by metal-plate printing. Then, vacuum drying is conducted and, after drying, one wherein the conductive paste is filled into the via hole is marked as O and one containing bubbles as X. The results are shown in Table 2.

TABLE 2

| Multilayer printed wiring board | Kind of conductive paste | Mixing ratio of resins* | 85° C. Elastic modulus (GPa) | Change in resistance (after 500 h, 85° C., 85%) | Filling ability into via hole |
|---|---|---|---|---|---|
| Example 6 | Example 1 | 70 | 0.02 | 2% | ○ |
| Example 7 | Example 2 | 70 | 1.3 | 4% | ○ |
| Example 8 | Example 3 | 70 | 1.7 | 14% | ○ |
| Example 9 | Example 4 | 60 | 1.5 | 6% | ○ |
| Example 10 | Example 5 | 85 | 1.1 | 68% | ○ |
| Comparative Example 4 | Comparative Example 1 | 70 | 2.7 | >100% | ○ |
| Comparative Example 5 | Comparative Example 2 | 100 | 0.5 | >100% | ○ |
| Comparative Example 6 | Comparative Example 3 | 0 | — | >100% | X |

*% by weight of epoxy resin having molecular weight of 10000 or more in resin

The conductive pastes of Examples 1 to 5 and Comparative Examples 1 and 2 using a resin containing an epoxy resin having a molecular weight of 10,000 or more in an amount of the lower limit (30% by weight) of the range of the invention or more exhibit an excellent filling ability into a via hole. However, in the case of the conductive paste of Comparative Example 6 using no epoxy resin having a molecular weight of 10,000 or more, the filling ability into a via hole is low.

The conductive paste of Comparative Example 1 wherein 85° C. elastic modulus exceeds 2 GPa and the conductive paste of Comparative Example 2 containing the epoxy resin having a molecular weight of 10,000 or more in an amount of the upper limit (90% by weight) of the range of the invention or more exhibit an excellent filling ability into a via hole but increase in connection resistance of the multilayer printed wiring boards manufactured using them with time is large when the boards are allowed to stand under an environment of high temperature and high humidity. Only Examples 1 to 5 wherein the content and 85° C. elastic modulus of the epoxy resin having a molecular weight of 10,000 or more fall within the range of the invention exhibit an excellent filling ability into a via hole and can also afford of high temperature and high humidity.

While the invention has been described in detail and with reference to specific embodiments thereof, it will be apparent to one skilled in the art that various changes and modifications can be made therein without departing from the spirit and scope thereof.

The present application is based on Japanese Patent Application No. 2004-286499 filed on Sep. 30, 2004, and the contents are incorporated herein by reference.

The invention claimed is:

1. A method for manufacturing a multilayer printed wiring board comprising:
   a step of forming a via hole in an insulating substrate having a conductive layer provided on one surface thereof, the via hole passing through to the conductive layer, and
   a step of filling a conductive paste into the via hole;
   a step of forming a bump of a conductive substance by filling the conductive paste, and
   a step of overlaying a wiring board base material obtained by forming a circuit on the conductive layer and an adhesive layer obtained by forming a through hole having a diameter larger that that of the via hole in a position, corresponding to the via hole, of the adhesive sheet so that the above adhesive layer comes into contact with the surface opposite to the above conductive layer, further overlaying another insulating substrate having a conductive layer circuit, and lamination-pressing thereof collectively, wherein:
   the conductive paste comprises:
     conductive particles; and
     a resin mixture,
   the resin mixture contains a high-molecular-weight epoxy resin and a low-molecular-weight epoxy resin,
   the high-molecular-weight epoxy resin has a weight-average molecular weight of 10,000 or more, and is from 60 to 85% by weight in the resin mixture,
   the low-molecular-weight epoxy resin has a weight-average molecular weight of 900 or less, and is from 15 to 40% by weight in the resin mixture,
   an elastic modulus of the resin mixture at 85° C. after curing is 2 GPa or less,
   the ratio of the conductive particles in the conductive paste is from 30 to 75% by volume, and
   the high-molecular-weight epoxy resin is a bisphenol A or F epoxy resin.

2. The method according to claim 1, wherein the diameter of the through hole formed in the adhesive layer is from 1.5 to 5 times of a diameter of the via hole formed in the insulating substrate.

3. The method according to claim 1, wherein the conductive particles contain a flat filler.

4. The method according to claim 2, wherein the conductive particles contain a flat filler.

* * * * *